(12) United States Patent
Liu et al.

(10) Patent No.: US 9,804,466 B2
(45) Date of Patent: Oct. 31, 2017

(54) METHOD OF MANUFACTURING ARRAY SUBSTRATE AND ARRAY SUBSTRATE

(71) Applicants: BOE Technology Group Co., Ltd., Beijing (CN); Beijing BOE Display Technology Co., Ltd., Beijing (CN)

(72) Inventors: Cong Liu, Beijing (CN); Yuchun Feng, Beijing (CN); Chunze Zhang, Beijing (CN); Zhaohui Hao, Beijing (CN); Lin Li, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 15/502,561

(22) PCT Filed: Jun. 13, 2016

(86) PCT No.: PCT/CN2016/085551
§ 371 (c)(1),
(2) Date: Feb. 8, 2017

(87) PCT Pub. No.: WO2017/071233
PCT Pub. Date: May 4, 2017

(65) Prior Publication Data
US 2017/0269411 A1    Sep. 21, 2017

(30) Foreign Application Priority Data

Oct. 26, 2015    (CN) .......................... 2015 1 0702114

(51) Int. Cl.
*G02F 1/1345* (2006.01)
*G02F 1/1368* (2006.01)
(Continued)

(52) U.S. Cl.
CPC ....... *G02F 1/1368* (2013.01); *G01R 31/2884* (2013.01); *G02F 1/136227* (2013.01);
(Continued)

(58) Field of Classification Search
None
See application file for complete search history.

(56) References Cited

U.S. PATENT DOCUMENTS

| 8,339,565 B2 | 12/2012 | Choi et al. |
| 8,970,816 B2 | 3/2015 | Gotoh et al. |

(Continued)

FOREIGN PATENT DOCUMENTS

| CN | 101907788 A | 12/2010 |
| CN | 102097440 A | 6/2011 |

(Continued)

OTHER PUBLICATIONS

International Search Report and Written Opinion of International Application No. PCT/CN2016/085551, dated Sep. 19, 2016, 9 pages.

(Continued)

*Primary Examiner* — Khaja Ahmad
(74) *Attorney, Agent, or Firm* — Westerman, Champlin & Koehler, P.A.

(57) ABSTRACT

A method of manufacturing an array substrate includes: forming a first functional layer comprising a plurality of array substrate areas and connection areas between adjacent array substrate areas; forming a plurality of conductive portions within each of the array substrate areas, the plurality of conductive portions extending from a corresponding one of the array substrate areas to a corresponding one of the connection areas and terminals of the plurality of conductive portions being in connection with capacitor lines within the corresponding one of the connection areas such that two (Continued)

capacitor lines between two adjacent array substrate areas face each other and are formed into a first capacitor element; forming a plurality of second functional layers on the first functional layer formed with the plurality of conductive portions and the capacitor lines, for forming a plurality of array substrates; and performing a cutting process at the connection areas between adjacent array substrates and removing the capacitor lines between the adjacent array substrates so as to form a plurality of separate array substrates. The present disclosure further provides an array substrate manufactured by the method.

14 Claims, 5 Drawing Sheets

(51) Int. Cl.
  *G02F 1/1362* (2006.01)
  *H01L 27/12* (2006.01)
  *H01L 21/78* (2006.01)
  *G01R 31/28* (2006.01)
(52) U.S. Cl.
  CPC ........ *G02F 1/136286* (2013.01); *H01L 21/78* (2013.01); *H01L 27/124* (2013.01); *H01L 27/1255* (2013.01); *H01L 27/1262* (2013.01); *G02F 2001/136295* (2013.01)

(56) References Cited

U.S. PATENT DOCUMENTS

| | | | |
|---|---|---|---|
| 2003/0146694 A1* | 8/2003 | Lee | H01L 27/3223 313/505 |
| 2005/0073250 A1* | 4/2005 | Abe | H01L 27/3288 313/505 |
| 2010/0309421 A1* | 12/2010 | Gotoh | G02F 1/136259 349/152 |
| 2015/0129875 A1 | 5/2015 | Gotoh et al. | |
| 2016/0190522 A1* | 6/2016 | Lee | H01L 51/0097 257/40 |

FOREIGN PATENT DOCUMENTS

| | | |
|---|---|---|
| CN | 102385207 A | 3/2012 |
| CN | 105355633 A | 2/2016 |

OTHER PUBLICATIONS

English translation of Box No. V of the Written Opinion for the International Searching Authority for International Application No. PCT/CN2016/085551, 2 pages.

* cited by examiner

METHOD OF MANUFACTURING ARRAY SUBSTRATE AND ARRAY SUBSTRATE

CROSS-REFERENCE TO RELATED APPLICATION

This application is a Section 371 National Stage application of International Application No. PCT/CN2016/085551, filed on Jun. 13, 2016, which has not yet published, and claims priority to Chinese Patent Application No. 201510702114.5 titled of "method of manufacturing array substrate and array substrate" filed on Oct. 26, 2015 in the State Intellectual Property Office of China, the disclosures of which are incorporated herein by reference in their entirety.

BACKGROUND

1. Technical Field

Embodiments of the present invention relate to a method of manufacturing an array substrate, and particularly to a method of manufacturing a plurality of array substrates by using a single substrate through a cutting process and an array substrate manufactured by the method.

2. Description of the Related Art

In prior arts, a liquid crystal panel of a display device mainly includes an array substrate, a color filter substrate arranged to be opposite to the array substrate and a liquid crystal layer between the color filter substrate and the array substrate. A method of manufacturing the array substrate mainly include the following steps: forming gate electrodes and gate lines electrically connected to the gate electrodes in a display region on a substrate, and forming common wires in a peripheral line region on the substrate; then, forming a gate electrode insulating layer by means of a plasma enhanced chemical vapor deposition (PECVD) process; forming an active layer on the gate electrode insulating layer; and forming a pattern of source electrodes and drain electrodes by means of a pattering process including an etching process.

In the above steps, during formation of the gate electrode insulating layer and an active layer by means of PECVD and formation of the pattern of the source electrodes and the drain electrodes by means of the pattering process including the etching process, since plasmas from a vacuum apparatus that performs PECVD process may not be ensured to be uniform and wirings designed in the array substrate are varied at different locations thereof, dense metal wires in the peripheral line region of the array substrate tends to occur abnormal arc discharge to burn out the gate lines and the data lines that are formed, causing failure of the final display panel product or break of the substrate and thus increasing failure ratio of product.

In an approach, arc discharge and burnout of the gate lines and data lines may be partially alleviated by adjusting line width of the test wires. However, in this approach, abnormal discharge will be caused on adjacent metal wires, which leads to failure of the product and fragment. Further, since the peripheral line region has a limited space for designing, adjustment of line width of the test lines and the common wires is limited, and thus abnormal discharge cannot be completely avoided.

SUMMARY

Embodiments of the present invention provide a method of manufacturing an array substrate and an array substrate manufactured by the method, which can reduce probability of arc discharge and burnout of conductive portions.

According to an aspect of the present disclosure, there is provided a method of manufacturing an array substrate, wherein the method comprises:

forming a first functional layer comprising a plurality of array substrate areas and connection areas between adjacent array substrate areas;

forming a plurality of conductive portions within each of the array substrate areas, the plurality of conductive portions extending from a corresponding one of the array substrate areas to a corresponding one of the connection areas and terminals of the plurality of conductive portions being in connection with capacitor lines within the corresponding one of the connection areas such that two capacitor lines between two adjacent array substrate areas face each other and are formed into a first capacitor element;

forming a plurality of second functional layers on the first functional layer formed thereon with the plurality of conductive portions and the capacitor lines, for forming a plurality of array substrates; and performing a cutting process at the connection areas between adjacent array substrates and removing the capacitor lines between the adjacent array substrates.

According to an embodiment of the present disclosure, each of the capacitor lines is formed in a curved shape.

According to an embodiment of the present disclosure, each of the capacitor lines is formed with a hollowed area.

According to an embodiment of the present disclosure, the hollowed area comprises a plurality of grids or stripe-shaped gratings integrally connected with each other.

According to an embodiment of the present disclosure, the plurality of conductive portions within each of the array substrate areas comprises:

a plurality of first conductive portions electrically connected to the capacitor line of the first capacitor element corresponding to the array substrate area; and a plurality of second conductive portions electrically connected to the capacitor line of another first capacitor element corresponding to the array substrate area.

According to an embodiment of the present disclosure, forming a plurality of conductive portions within each of the array substrate areas further comprises forming connection lines that are in electrical connection to the first conductive portions or the second conductive portions, wherein the connection lines of two adjacent array substrate areas are coupled to each other via second capacitor elements.

According to an embodiment of the present disclosure, the connection lines, the second capacitor elements, the capacitor lines, the first conductive portions and the second conductive portions are formed from the same material through a single patterning process.

According to an embodiment of the present disclosure, the first functional layer comprises a substrate, the first conductive portions are common wires and the conductive portions are test wires.

According to an embodiment of the present disclosure, the substrate is provided with, on the substrate, gate lines, gate electrodes of thin film transistors that are in connection with the gate lines and gate electrode bonding pads electrically connected to the gate electrodes, wherein the second conductive portions are electrically connected with the gate electrode bonding pads, and the common wires, the capacitor lines, the gate lines, and the gate electrodes that are in connection with the gate lines, and the gate electrode welding pads are formed on the substrate from the same material through a single patterning process.

According to an embodiment of the present disclosure, forming a plurality of second functional layers on the first functional layer formed with the plurality of conductive portions and the capacitor lines so as to form a plurality of array substrates comprises:

forming a gate electrode insulating layer covering the common wires, the capacitor lines, the gate lines, the gate electrodes and the gate electrode bonding pads, and further forming through-holes in the gate electrode insulating layer; and forming the test wires, the connection lines and the second capacitor elements on the gate electrode insulating layer from the same material through a single patterning process, such that the test wires are electrically connected with the gate electrode bonding pads through the through-holes.

According to an embodiment of the present disclosure, forming a plurality of second functional layers on the first functional layer formed with the plurality of conductive portions and the capacitor lines so as to form a plurality of array substrates further comprises:

forming, on the gate electrode insulating layer in order, source electrodes, drain electrodes, a passivation layer covering the source electrodes and the drain electrodes, and pixel electrodes formed on the passivation layer and being in connection with the drain electrodes via through-holes in the passivation layer.

According to an embodiment of the present disclosure, the substrate is provided with, on the substrate, gate lines, gate electrodes of thin film transistors that are in connection with the gate lines and a gate electrode bonding pads electrically connected to the gate electrodes, wherein the test wires are electrically connected to the gate electrode bonding pads, and the common wires, the capacitor lines, the test wires, the connection lines, the second capacitor elements, the gate lines, the gate electrodes and the gate electrode bonding pads are formed on the substrate from the same material via through a single patterning process.

According to an embodiment of the present disclosure, forming the second functional layers on the first functional layer formed with the plurality of conductive portions and the capacitor lines so as to form a plurality of array substrate comprises:

forming a gate electrode insulating layer covering the common wires, the gate lines, the gate electrodes and the gate electrode bonding pads.

According to another aspect of the present disclosure, there is provided an array substrate, wherein, the array substrate is formed by the method according to any one of the above embodiments.

BRIEF DESCRIPTION OF THE DRAWINGS

In order to more clearly understand the objects, features and advantages of the present disclosure, a further detailed description of the present disclosure will be made with reference to embodiments of the present invention taken in conjunction with the accompanying drawings, in which.

DETAILED DESCRIPTION OF THE EMBODIMENTS

Technique schemes of the present disclosure will be further described specifically with reference to embodiments taken in conjunction with the accompanying drawings. In the description, similar or same reference symbol denotes to similar or same component. The description of the embodiments of the disclosure with reference to drawings is intended to interpret inventive concepts of the present disclosure, instead of limiting the present disclosure.

According to a general inventive concept of the present disclosure, there is provided a method of manufacturing an array substrate, comprising: forming a first functional layer comprising a plurality of array substrate areas and connection areas between adjacent array substrate areas; forming a plurality of conductive portions within each of the array substrate areas, the conductive portions extending from a corresponding one of the array substrate areas to a corresponding one of the connection areas and terminals of the plurality of conductive portions being in connection with capacitor lines within the corresponding one of the connection areas such that two capacitor lines between two adjacent array substrate areas face to each other and are formed into a first capacitor element, the conductive portions including first conductive portions and second conductive portions which may be arranged in the same layer or in different layers; forming a plurality of second functional layers on the first functional layer formed with the plurality of conductive portions and the capacitor lines, for forming a plurality of array substrates; and performing a cutting process or operation at the connection areas between adjacent array substrates and removing the capacitor lines between the adjacent array substrates, so as to form a plurality of separate array substrates. By forming the first capacitor elements by the two capacitor lines between two adjacent array substrate areas, charge release passages are additionally formed on the conductive portions so as to store the excess charges generated on the conductive portions, thereby reducing probabilities of arc discharge of the first conductive portions and thus burnout of the conductive portions.

Much specific details of the present disclosure will be described as below to sufficiently understand embodiments of the present disclosure. However, it is obvious that one or more embodiments may be implemented without these details. In other cases, known structure and device are schematically illustrated so as to simplify the drawings.

Figure 1:
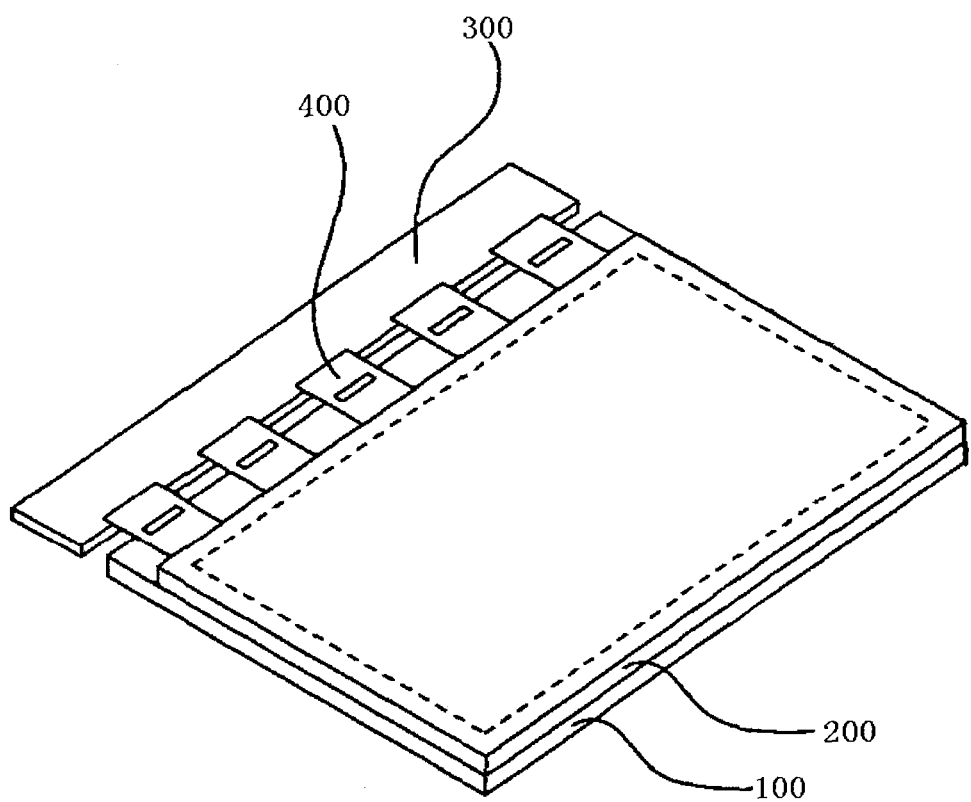
FIG. 1 is a schematic perspective view of a display panel including an array substrate manufactured by a method according to an exemplary embodiment of the present disclosure.
Figure 2:
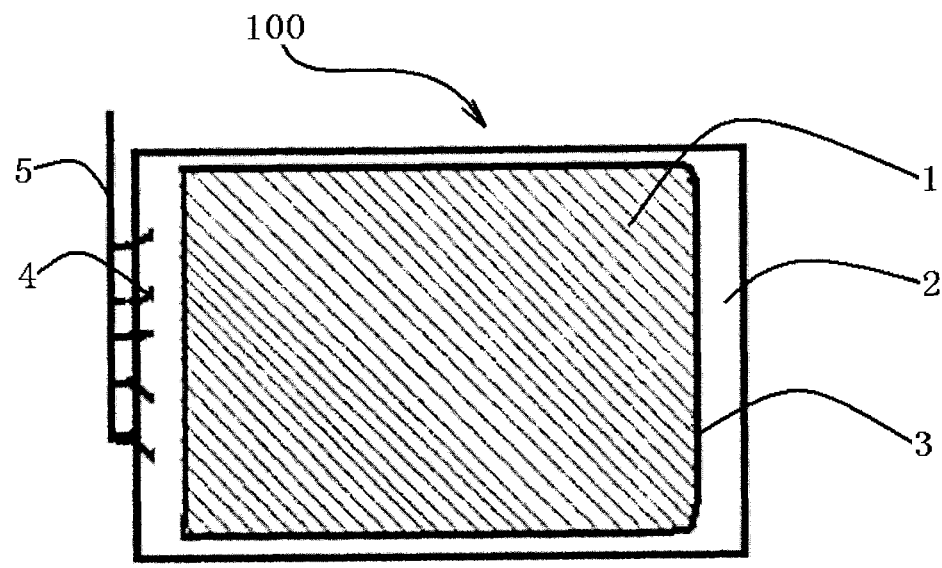
FIG. 2 is a schematic plan view of an array substrate manufactured by a method according to an exemplary embodiment of the present disclosure.

FIG. 1 is a schematic perspective view of a display panel including an array substrate that is manufactured by a method according to an exemplary embodiment of the present disclosure; FIG. 2 is a schematic plan view of an array substrate that is manufactured by a method according to an exemplary embodiment of the present disclosure.

Referring to FIGS. 1 and 2, a typical display panel mainly includes an array substrate 100 and a color filter substrate 200 arranged to be opposite to the array substrate 100. The array substrate 100 mainly includes a display area 1 in which a plurality of pixel areas are provided and a peripheral line region 2 where a plurality of common lines 3 are provided. The common lines 3 are in electrical connection with a signal drive circuit 300 through a tape carrier package (TCP) 400 such that the signal drive circuit 300 may control operation of the array substrate. In the peripheral line region 2, there are further formed a plurality of bonding pads 4 that are in electrical connection with gate electrodes of thin film transistors (TFT) provided in the display area 2. A plurality of array test lines (AT lines) 5 are electrically respectively connected to the gate electrodes by the gate electrode bonding pads 4 to test properties of respective sub-pixels in the display array substrate 100.

Figure 3:
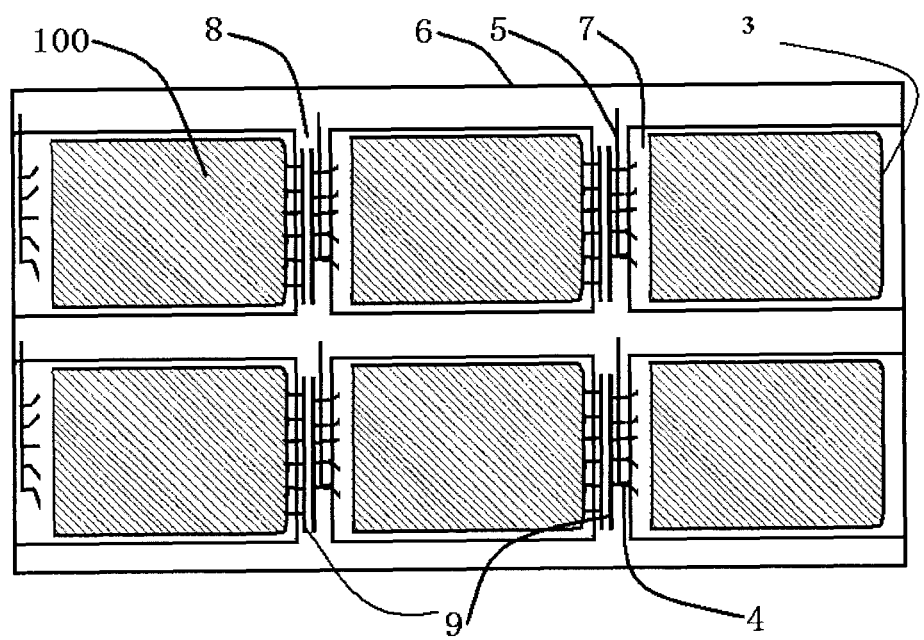
FIG. 3 is a schematic plan view of a plurality of array substrates manufactured by a method according to an exemplary embodiment of the present disclosure, with the plurality of array substrates being not cut.

FIG. 3 is a schematic plan view of a plurality of array substrates that are manufactured by a method according to an exemplary embodiment of the present disclosure, in which the plurality of array substrates are still not separated from each other by cutting. Referring to FIG. 3, a method of manufacturing a display panel according to an exemplary embodiment of the present disclosure includes the following steps: forming a first functional layer 6, which, in an embodiment, may include a substrate made of for example glass or transparent resin material and a buffer layer formed on the substrate, the first functional layer 6 being partitioned into a plurality of array substrate areas 7, each of which is used to form an array substrate 100 as shown in FIG. 2, and connection areas 8 being provided between adjacent array substrate areas 7; forming a plurality of conductive portions in each of the array substrate areas 7 such that the plurality of conductive portions extend from a corresponding one of the array substrate areas 7 to a corresponding one of the connection areas 8, and terminals of the conductive portions are in electrical connection with the capacitor lines 9 within the corresponding one of the connection area 8 such that two capacitor lines 9 between two adjacent array substrate areas 8 face each other and are formed into a first capacitor element; forming a plurality of second functional layers (not shown) on the first functional layer 6, on which the conductive portions and the capacitor lines 9 are formed, so as to form a plurality of array substrates 100, and cutting the substrate at the connection area 8 between adjacent array substrates 100 and removing the capacitor lines 9 between the adjacent array substrates, so as to form a plurality of individual array substrates 100 as shown in FIG. 2.

With the method of manufacturing an array substrate according to embodiments of the present disclosure, the first capacitor elements are formed by two capacitor lines 9 formed between two adjacent array substrate areas 7 such that charge release passages are additionally formed on the conductive portions when forming the second functional layers on the first functional layer 6 formed with the conductive portions so as to store the excess charges generated on the conductive portions, thereby reducing probabilities of arc discharge on the first conductive portions and thus burnout of the conductive portions and the first functional layer. Further, even though the conductive portions 9 would have been burned out, the performance of the array substrate obtained would not be affected by the burned-out capacitor lines since the capacitor lines 9 and the connection areas 8 would be removed in a subsequent cutting process. Thus, the method of manufacturing an array substrate according to embodiments of the present disclosure may be implemented to increase product yield and reduce product cost.

Figure 4:
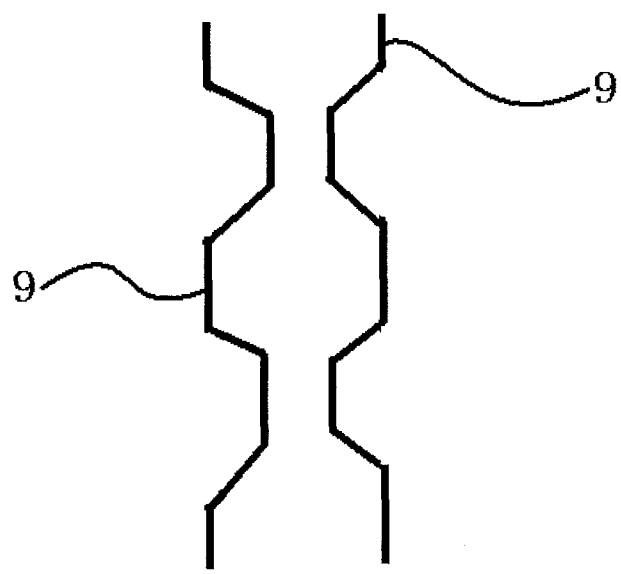
FIG. 4 is a schematic principle view of a capacitor element according to the exemplary embodiment of the present disclosure.
Figure 5:
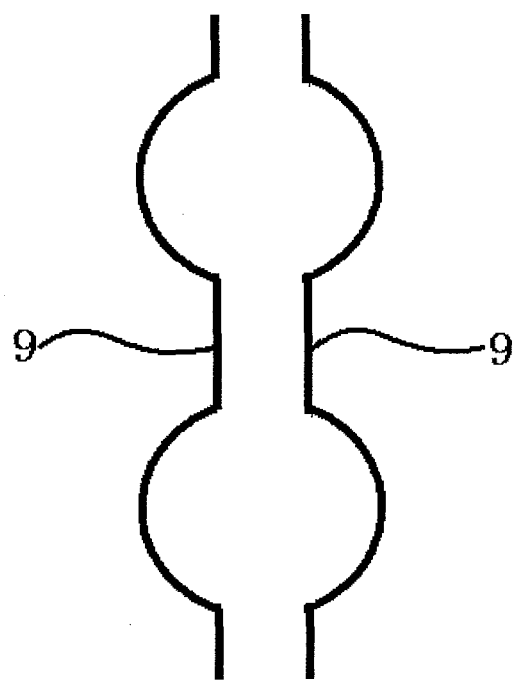
FIG. 5 is a schematic principle view of a capacitor element according to an another exemplary embodiment of the present disclosure.

FIG. 4 is a schematic principle view of a capacitor element according to an exemplary embodiment of the present disclosure and FIG. 5 is a schematic principle view of a capacitor element according to a second exemplary embodiment of the present disclosure. As shown in FIGS. 4 and 5, the capacitor lines 9 are each formed in a curved shape. Specifically, in the embodiment of the capacitor element as shown in FIG. 4, the capacitor lines 9 are each formed as a substantially sawtooth shape. In another exemplary embodiment of the capacitor element as shown in FIG. 5, the capacitor lines 9 are each formed as a substantially arc shape. The capacitor lines 9 for forming two capacitor electrodes of the first capacitor element are not arranged in parallel to each other, or in other words, a distance between the two capacitor electrodes is not constant. In this arrangement, charge receiving ability of the capacitor lines 9 is not even and is varied at different locations, and thus the excess charges may be released at weak locations of the capacitor lines once the charges accumulated on the capacitor lines excess a standard amount, thereby obtaining enhancement in leading and releasing the abnormal discharge. That is, the abnormal discharge may be lead to the capacitor lines to reduce probability of the abnormal discharge which will otherwise take place on the conductive portions, thereby further avoiding probability of burnout of the conductive portions and the first functional layer.

As shown in FIGS. 2 and 3, in an exemplary embodiment, the conductive portions of each of the array substrate areas 7 include a plurality of first conductive portions 3 that are in electrical connection with the capacitor line 9 of one first capacitor element of the array substrate area 7 and a plurality of second conductive portions 5 that are in electrical connection with the capacitor line 9 of another capacitor element of the array substrate area 7. That is, in each of the array substrate areas 7, the first conductive portions 3 are in electrical connection with the capacitor line 9 of the first capacitor element located at a right side of the array substrate area 7 and the second conductive portions 5 are in electrical connection with the capacitor line 9 of the first capacitor element located at a left side of the array substrate area 7. In this configuration, the first conductive portions 3 and the second conductive portions 5 of a plurality of adjacent array substrate areas 7 are respectively formed into charge releasing passages for each other, thereby reducing probability of burnout of the conductive portions and the first functional layer due to abnormal discharge.

Figure 6:
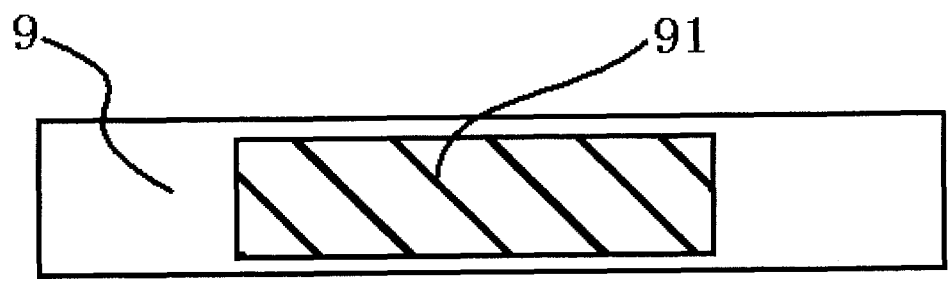
FIG. 6 is a schematic plan view of an electrode of a capacitor element according to the exemplary embodiment of the present disclosure.
Figure 7:
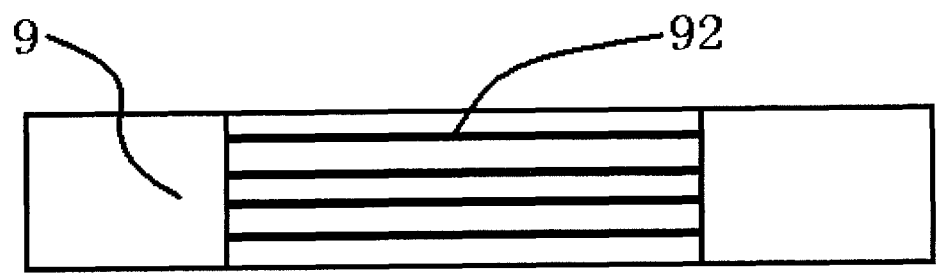
FIG. 7 is a schematic plan view of an electrode of a capacitor element according to the another exemplary embodiment of the present disclosure.
Figure 8:
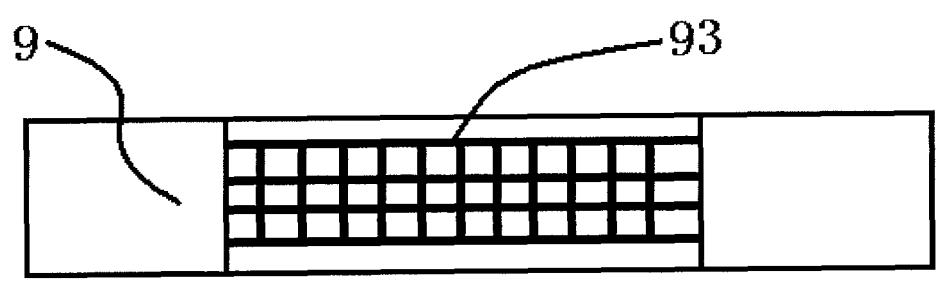
FIG. 8 is a schematic plan view of a counter electrode of a capacitor element according to a still one exemplary embodiment of the present disclosure.

FIGS. 6-8 are schematic plan views of an electrode of a capacitor element according to three embodiments of the present disclosure. As shown in FIGS. 6-8, each of the capacitor lines 9 is formed with a hollowed area. Specifically, in the embodiment of the capacitor line 9 as shown in FIG. 6, the hollowed area includes a plurality of oblique stripe-shaped gratings 91 integrally connected with each other; in the embodiment of the capacitor element as shown in FIG. 7, the hollowed area includes a plurality of horizontal stripe-shaped gratings 92 integrally connected with each other; in the embodiment of the capacitor element as shown in FIG. 8, the hollowed area includes a plurality of integrally connected grids 93. Due to formation of the hollowed area in the capacitor line 9, leading and releasing of the abnormal discharge may be enhanced and risk of accumulation of charges on the metal wires to an extreme may be reduced, thereby further reducing probability of abnormal discharge on the conductive portions and burnout of the conductive portions and the first functional layer.

Figure 9:
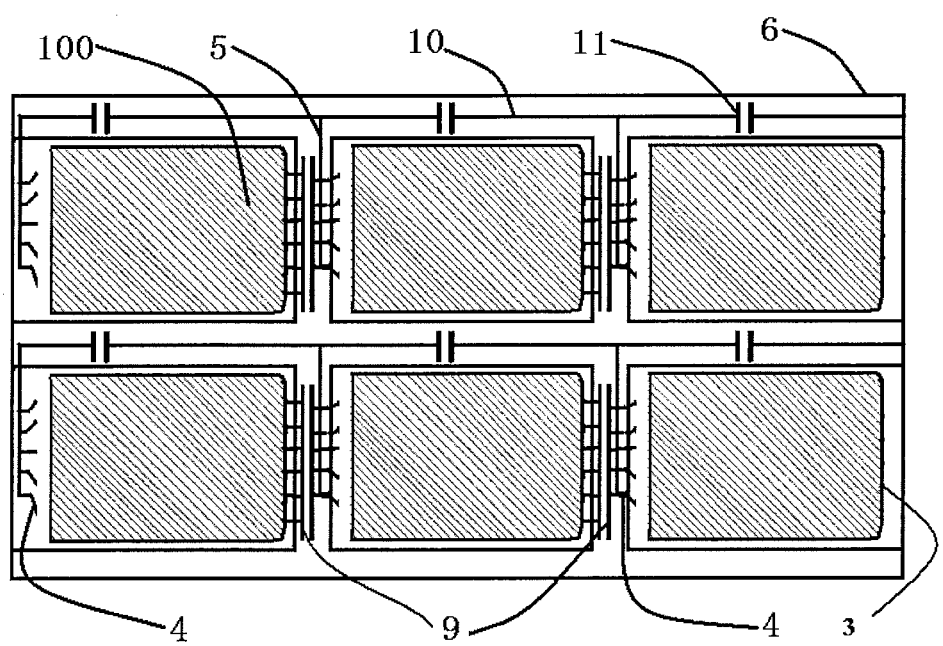
FIG. 9 is a schematic plan view of a plurality of array substrates manufactured by a method according to another exemplary embodiment of the present disclosure, in which the plurality of array substrates are not separated from each other by cutting.

FIG. 9 is a schematic plan view of a plurality of array substrates manufactured by a method according to another embodiment of the present disclosure, in which the plurality of array substrates are still not be separated from each other by cutting. In an exemplary embodiment, in the step of forming the plurality of conductive portions within each of the array substrate areas 7, connection lines 10 that are in electrical connection with the first conductive portions or the second conductive portions are further formed, and the connection lines 10 within two adjacent array substrate areas 7 are coupled to each other through the second capacitor elements 11. In this configuration, the plurality of array substrate areas 7 are coupled through the second capacitor elements 11, forming a group of capacitors for discharging and thus further adding charge releasing passages and improving effective leading and storage of charges.

It is understood that the capacitor electrodes for forming the second capacitor elements may have the same configuration as the capacitor lines of the first capacitor elements, i.e., have a substantially sawtooth shape and are formed with hollowed areas, so as to further improve ability of effectively leading and storing charges.

In an exemplary embodiment, the connection lines 10, the second capacitor elements 11, the capacitor lines 9, the first conductive portions 3 and the second conductive portions 5 are formed from the same material such as Indium Tin Oxide (ITO) and are formed through a single patterning process. As such, it is advantageous to reduce number of patterning processes, number of masks that are used and manufacturing cost.

In an exemplary embodiment, the first functional layer 6 includes a transparent substrate and conductive portions, and the conductive portions include first conductive portions 3 that are used as common wires 3 and second conductive portions 5 that are used as test wires 5. In this configuration, as shown in FIGS. 2 and 3, in one array substrate area 7, the common wires 3 are electrically connected to the capacitor line 9 of the first capacitor element located at right side of the array substrate area 7 and the test wires 5 are electrically connected to the capacitor line 9 of the first capacitor element located at left side of the array substrate area 7.

FIGS. 2 and 3 just illustrate one implementation of the present disclosure, and however, the present disclosure may include other implementations. For example, the first conductive portions 3, i.e., the common wires 3, are electrically connected to one capacitor line 9 of the first capacitor element located at left side of the array substrate area 7, and the second conductive portions 5, i.e., the test wires 5, are electrically connected to the capacitor line 9 of the first capacitor element at right side of the array substrate area 7. With this configuration, the common wires and the test wires of the plurality of adjacent array substrate areas 7 are mutually used as the charge releasing passages, such that charge release passages are additionally formed on the common wires when forming the second functional layers on the substrate formed with the common wires and the test wires, and the excess charges generated on the common wires and the test wires may be stored, thereby reducing probabilities of arc discharge of the first conductive portions and thus burnout of the common wires, the test wires and the first functional layer. Further, even though the conductive portions 9 would have been burned out, the performance of the array substrate obtained would not be affected by the burned-out capacitor lines since the capacitor lines 9 and the connection areas 8 would be removed in a subsequent cutting process.

The method according to the present disclosure is adapted to manufacture an array substrate of a thin film transistor-liquid crystal display (TFT-LCD). Each of pixel regions formed on the array substrate mainly includes a transparent substrate and gate electrodes, gate lines, a gate insulating layer, source electrodes, drain electrodes, data lines, a passivation layer and pixel electrodes formed on the substrate in order. Parts of the common wires are respectively electrically connected to the gate lines and the data lines.

In an exemplary embodiment, the substrate is provided with gate lines, gate electrodes of thin film transistors that are electrically connected to the gate lines, and gate electrode bonding pads 4 that are electrically connected to the gate electrodes. The test wires 5, that is, the second conductive portions, are electrically connected to the gate electrode bonding pads 4 formed on the substrate, and the common wires 3, the capacitor lines 9, the test wires 5 and the gate lines, and the gate electrodes and the gate electrode bonding pads 4, which are electrically connected to the gate lines, of the thin film transistors are formed on the substrate from the same material through a single patterning process. Parts of the common wires are respectively electrically connected to the gate lines and the data lines. With this configuration, the common wires 3 and the test wires 5 formed on the substrate can be prevented from being burned out during the subsequent processes of forming the source electrodes, the drain electrodes and the pixel electrodes of the thin film transistors due to abnormal discharge, and thus product yield may be increased.

In an exemplary embodiment, the plurality of second functional layers include a gate electrode insulating layer. The step of forming the second functional layers on the first functional layer 6, on which the conductive portions and the capacitor lines 9 are formed, so as to form the plurality of array substrates includes: forming a gate electrode insulating layer covering the common wires 3, the capacitor lines 9, the gate lines, the gate electrodes and the gate electrode bonding pads 4, and further forming through-holes in the gate electrode insulating layer, such that the second functional layers include the gate electrode insulating layer; and, forming the test wires 5, the connection lines 10 and the second capacitor elements 11 on the gate electrode insulating layer from the same material through a single patterning process, the test wires 5 being in electrical connection with the gate electrode bonding pads 4 through the through-holes. With this configuration, the test wires 5 formed on the gate electrode insulating layer may be avoided from being burned out in subsequent processes due to abnormal discharge, thereby increasing product yield.

With the method of manufacturing an array substrate according to the embodiments of the present disclosure, after the common wires 3, the gate lines for the TFT and the gate electrodes and the gate electrode bonding pads 4 that are in electrical connection with the gate lines have been formed on the substrate and during formation of the gate electrode insulating layer and the active layer by forming $SiN_x$ and/or $SiO_2$ film through a plasma enhanced chemical vapor deposition (PECVD) process and formation of a pattern of the source electrodes and the drain electrodes by a dry etch process, abnormal arc discharge would never occur on the dense conductive portions arranged on the array substrate areas even though plasmas are not uniform during the PECVD process and thus final product yield of the display panel may be increased.

In an exemplary embodiment, the step of forming the second functional layers on the first functional layer 6 formed with the plurality of conductive portions and the capacitor lines 9 so as to form a plurality of array substrates further includes: sequentially forming source electrodes and drain electrodes, a passivation layer covering the source electrodes and the drain electrodes, and pixel electrodes that are formed on the passivation layer and are in electrical connection with the drain electrodes via through-holes in the passivation layer, such that one array substrate is formed in each array substrate area, and then the first capacitor elements and the second capacitor elements are removed in a subsequent cutting process, obtaining separate array substrates. The method of manufacturing an array substrate according to embodiments of the present disclosure may be implemented in other manufacturing processes, such as passivation layer or flat layer manufacturing process, or cutting process, to play a role as an electrostatic protection circuit.

In an embodiment, after forming the array substrates from the array substrate areas, a plurality of color filter substrates may be assembled respectively to the array substrates to form a plurality of display panels. Then, the cutting process is performed to remove the first capacitor elements and the second capacitor elements, obtaining separate display panels.

In an alternative embodiment, the substrate is provided with the gate lines, the gate electrodes that are in electrical connection with the gate lines of thin film transistors and the gate electrode bonding pads that are in electrical connection with the gate electrodes. The test lines are electrically connected to the gate electrode bonding pads. The common wires, the capacitor lines, the test lines, the connection lines, the second capacitor elements, the gate lines, the gate electrodes and the gate electrode bonding pads are formed on the substrate from the same material (for example, tin indium oxide) through a single patterning process. In this way, the number of patterning the processes, number of masks that are used and manufacturing cost may be reduced.

Further, the step of forming the second functional layers on the first functional layer formed with a plurality of conductive portions and the capacitor lines so as to form a plurality of array substrate comprises: forming a gate electrode insulating layer covering the common wires, the gate lines, the gate electrodes and the gate electrode bonding pads. In this way, the second functional layers include the gate electrode insulating layer. Then, source electrodes and drain electrodes, the passivation layer covering the source electrodes and the drain electrodes, and pixel electrodes that are formed on the passivation layer and are in electrical connection with the drain electrodes via the through-holes in the passivation layer are formed on the gate electrode insulating layer in order, such that one array substrate may be formed in each of the array substrate areas and, then the first capacitor elements and the second capacitor elements are removed in a subsequent cutting process, obtaining separate array substrates.

The method of manufacturing an array substrate according to embodiments of the present disclosure are described with reference to the TFT-LCD as an example, but the present disclosure is not limited to this. In an alternative embodiment, the array substrate may be an array substrate of an organic light emitting diode (OLED) unit and an active matrix organic light emitting diode (AMOLED) unit.

The first functional layer described above is an embodiment that includes the substrate, but the present disclosure is not limited to that. In an alternative embodiment, the first functional layer may include a gate electrode insulating layer or an intermediate dielectric layer.

According to a further embodiment of the present disclosure, there is provided an array substrate manufactured by the method according to the above embodiments. The array substrate may be applied in a display device. The display device may be a mobile phone, a tablet computer, a television, a display, a notebook computer, a digital photo frame, a navigator, an electronic paper or any other products or components that have a displaying function.

With the method of manufacturing an array substrate and the array substrate according to embodiments of the present disclosure, the first capacitor element are formed by two capacitor lines between two adjacent array substrate areas such that charge releasing passages may be additionally formed on the conductive portions when forming the second functional layers on the first functional layer formed with the conductive portions, to store excess charges on the conductive portions, reducing probabilities of occurring arc discharge on the first conductive portions and burnout of the conductive portions and the first functional layer. Further, even though the capacitor lines would be burned out, performance of the array substrates would never be affected by the burned capacitor lines since the capacitor lines and the connection areas will be removed in the subsequent cutting process. Thus, the array substrate manufactured by the method of the present disclosure may render increased yield of product and reduced manufacturing cost.

Detailed description of objects, schemes and advantageous effects of the present disclosure has been made in the above described embodiments. It is understood that the above description merely illustrates exemplary embodiments of the present disclosure, but is not used to limit the present invention. Any modification, equally replacement and development made within the spirit and scope of the present invention shall be included in the protective scope of the present invention.

The invention claimed is:

1. A method of manufacturing an array substrate, wherein the method comprises:
    forming a first functional layer comprising a plurality of array substrate areas and connection areas between adjacent array substrate areas;
    forming a plurality of conductive portions within each of the array substrate areas, the plurality of conductive portions extending from a corresponding one of the array substrate areas to a corresponding one of the connection areas and terminals of the plurality of conductive portions being in connection with capacitor lines within the corresponding one of the connection areas such that two capacitor lines between two adjacent array substrate areas face each other and are formed into a first capacitor element;
    forming a plurality of second functional layers on the first functional layer formed thereon with the plurality of conductive portions and the capacitor lines, for forming a plurality of array substrates;
    performing a cutting process at the connection areas between adjacent array substrates and removing the capacitor lines between the adjacent array substrates;
    wherein, the plurality of conductive portions within each of the array substrate areas comprises:

a plurality of first conductive portions electrically connected to a capacitor line of the first capacitor element corresponding to an array substrate area; and a plurality of second conductive portions electrically connected to a capacitor line of another first capacitor element corresponding to an array substrate area;

wherein, forming a plurality of conductive portions within each of the array substrate areas further comprises forming connection lines that are in electrical connection to the first conductive portions or the second conductive portions, wherein the connection lines of two adjacent array substrate areas are coupled to each other via second capacitor elements; and wherein, the connection lines, the second capacitor elements, the capacitor lines, the first conductive portions and the second conductive portions are formed from the same material through a single patterning process.

2. The method according to claim 1, wherein, each of the capacitor lines is formed in a curved shape.

3. The method according to claim 1, wherein, each of the capacitor lines is formed with a hollowed area.

4. The method according to claim 3, wherein, the hollowed area comprises a plurality of grids or stripe-shaped gratings integrally connected with each other.

5. The method according to claim 1, wherein, the first functional layer comprises a substrate, the first conductive portions are common wires and the conductive portions are test wires.

6. The method according to claim 5, wherein the method further comprises providing, on the substrate, gate lines, gate electrodes of thin film transistors that are in connection with the gate lines and gate electrode bonding pads electrically connected to the gate electrodes, wherein the second conductive portions are electrically connected with the gate electrode bonding pads, and the common wires, the capacitor lines, the gate lines, and the gate electrodes that are in connection with the gate lines, and the gate electrode welding pads are formed on the substrate from the same material through a single patterning process.

7. The method according to claim 6, wherein, forming a plurality of second functional layers on the first functional layer formed with the plurality of conductive portions and the capacitor lines so as to form a plurality of array substrates comprises:

forming a gate electrode insulating layer covering the common wires, the capacitor lines, the gate lines, the gate electrodes and the gate electrode bonding pads, and further forming through-holes in the gate electrode insulating layer; and forming the test wires, the connection lines and the second capacitor elements on the gate electrode insulating layer from the same material through a single patterning process, such that the test wires are electrically connected with the gate electrode bonding pads through the through-holes.

8. The method according to claim 7, wherein, forming a plurality of second functional layers on the first functional layer formed with the plurality of conductive portions and the capacitor lines so as to form a plurality of array substrates further comprises:

forming, on the gate electrode insulating layer in order, source electrodes, drain electrodes, a passivation layer covering the source electrodes and the drain electrodes, and pixel electrodes formed on the passivation layer and being in connection with the drain electrodes via through-holes in the passivation layer.

9. The method according to claim 5, wherein the method further comprises providing, on the substrate, gate lines, gate electrodes of thin film transistors that are in connection with the gate lines and a gate electrode bonding pads electrically connected to the gate electrodes, wherein the test wires are electrically connected to the gate electrode bonding pads, and the common wires, the capacitor lines, the test wires, the connection lines, the second capacitor elements, the gate lines, the gate electrodes and the gate electrode bonding pads are formed on the substrate from the same material via through a single patterning process.

10. The method according to claim 9, wherein, forming the second functional layers on the first functional layer formed with the plurality of conductive portions and the capacitor lines so as to form a plurality of array substrate comprises:

forming a gate electrode insulating layer covering the common wires, the gate lines, the gate electrodes and the gate electrode bonding pads.

11. An array substrate, wherein, the array substrate is formed by the method according to claim 1.

12. The method according to claim 2, wherein, the plurality of conductive portions within each of the array substrate areas comprises:

a plurality of first conductive portions electrically connected to the capacitor line of the first capacitor element corresponding to the array substrate area; and a plurality of second conductive portions electrically connected to the capacitor line of another first capacitor element corresponding to the array substrate area.

13. The method according to claim 3, wherein, the plurality of conductive portions within each of the array substrate areas comprises:

a plurality of first conductive portions electrically connected to the capacitor line of the first capacitor element corresponding to the array substrate area; and a plurality of second conductive portions electrically connected to the capacitor line of another first capacitor element corresponding to the array substrate area.

14. The method according to claim 4, wherein, the plurality of conductive portions within each of the array substrate areas comprises:

a plurality of first conductive portions electrically connected to the capacitor line of the first capacitor element corresponding to the array substrate area; and a plurality of second conductive portions electrically connected to the capacitor line of another first capacitor element corresponding to the array substrate area.

* * * * *